(12) United States Patent
    Mishima

(10) Patent No.: US 11,456,435 B2
(45) Date of Patent: *Sep. 27, 2022

(54) ORGANIC ELECTROLUMINESCENT ELEMENT, ORGANIC ELECTROLUMINESCENT UNIT, AND ELECTRONIC APPARATUS

(71) Applicant: JOLED INC., Tokyo (JP)

(72) Inventor: Kosuke Mishima, Tokyo (JP)

(73) Assignee: JOLED INC., Tokyo (JP)

( * ) Notice: Subject to any disclaimer, the term of this patent is extended or adjusted under 35 U.S.C. 154(b) by 13 days.

This patent is subject to a terminal disclaimer.

(21) Appl. No.: 16/028,416

(22) Filed: Jul. 6, 2018

(65) Prior Publication Data

US 2019/0019973 A1    Jan. 17, 2019

(30) Foreign Application Priority Data

Jul. 13, 2017   (JP) .............................. JP2017-136912
Apr. 6, 2018    (JP) .............................. JP2018-073950

(51) Int. Cl.
    *H01L 51/50*    (2006.01)
    *H01L 51/52*    (2006.01)

(52) U.S. Cl.
    CPC .......... *H01L 51/5076* (2013.01); *H01L 51/50* (2013.01); *H01L 51/5092* (2013.01); *H01L 51/5096* (2013.01); *H01L 51/5004* (2013.01); *H01L 51/5265* (2013.01); *H01L 2251/301* (2013.01); *H01L 2251/552* (2013.01)

(58) Field of Classification Search
    IPC .............. H01L 51/56,51/5008, 51/50, 51/5016, 51/504, 27/3211, 51/5004, 2251/5384
    See application file for complete search history.

(56) References Cited

U.S. PATENT DOCUMENTS

| | | | | |
|---|---|---|---|---|
| 6,023,073 A | * | 2/2000 | Strife | H01L 51/506 257/40 |
| 10,529,941 B2 | * | 1/2020 | Mishima | G09G 3/3258 |
| 2003/0044587 A1 | * | 3/2003 | Lu | H01L 51/5203 428/209 |
| 2006/0119255 A1 | * | 6/2006 | Kimura | C09K 11/06 313/504 |
| 2006/0157728 A1 | * | 7/2006 | Iou | H01L 51/5048 257/103 |

(Continued)

FOREIGN PATENT DOCUMENTS

| | | |
|---|---|---|
| JP | 2013-38432 A | 2/2013 |
| JP | 2014-82524 A | 5/2014 |
| JP | 2015-109470 A | 6/2015 |

*Primary Examiner* — Hrayr A Sayadian

(74) *Attorney, Agent, or Firm* — Hauptman Ham, LLP

(57) ABSTRACT

An organic electroluminescent element includes, in order, a first electrode, an organic light-emitting layer, a buffer layer, a metal thin film, an organic electron transport layer, and a second electrode. The buffer layer includes an electrically-conductive organic material. The metal thin film includes a metal or a metal alloy. The organic electron transport layer is doped with a metal. The metal in the metal thin film is the same as the metal doped in the organic electron transport layer. The metal alloy in the metal thin film includes a metal that is the same as the metal doped in the organic electron transport layer.

11 Claims, 9 Drawing Sheets

(56) References Cited

U.S. PATENT DOCUMENTS

| | | | |
|---|---|---|---|
| 2007/0285003 A1* | 12/2007 | Smith | H01L 51/5262 |
| | | | 313/504 |
| 2009/0072715 A1* | 3/2009 | Suzuri | H01L 51/5076 |
| | | | 313/504 |
| 2015/0144897 A1* | 5/2015 | Kang | H01L 51/5076 |
| | | | 257/40 |
| 2017/0194588 A1* | 7/2017 | Lei | H01L 51/504 |
| 2017/0279064 A1* | 9/2017 | Wallikewitz | H01L 51/508 |
| 2019/0019973 A1* | 1/2019 | Mishima | H01L 51/5092 |

\* cited by examiner

ORGANIC ELECTROLUMINESCENT ELEMENT, ORGANIC ELECTROLUMINESCENT UNIT, AND ELECTRONIC APPARATUS

CROSS REFERENCE TO RELATED APPLICATIONS

This application claims the benefit of Japanese Priority Patent Application Nos. 2017-136912 filed on Jul. 13, 2017, and 2018-73950 filed on Apr. 6, 2018, the entire contents of each of which are incorporated herein by reference.

BACKGROUND

The disclosure relates to an organic electroluminescent element, an organic electroluminescent unit, and an electronic apparatus.

A variety of organic electroluminescent units, such as organic electroluminescent displays, including organic electroluminescent elements have been proposed. The organic electroluminescent elements each generate excitons through recombination, in a light-emitting layer, of electrons injected from a cathode and holes injected from an anode and emit light when the excitons return to a low energy level or a ground state. Accordingly, efficient carrier injection is needed for the organic electroluminescent elements.

Electron injection, which is one of techniques for carrier injection, uses an electron injection layer as an organic layer through which electrons are injected into a light-emitting layer. The electron injection layer includes an organic material doped with a low-work function metal. Reference is made to Japanese Unexamined Patent Application Publication Nos. 2013-38432, 2014-82524, and 2015-109470, for example.

SUMMARY

Unfortunately, the use of such an electron injection layer may cause diffusion, into the light-emitting layer, of the metal doped in the electron injection layer. This may possibly lead to a reduction in light emission efficiency.

It is desirable to provide an organic electroluminescent element, an organic electroluminescent unit, and an electronic apparatus that make it possible to suppress a reduction in light emission efficiency.

An organic electroluminescent element according to one embodiment of the disclosure includes a first electrode, an organic light-emitting layer, an organic electron transport layer doped with a metal, and a second electrode, in this order. The organic electroluminescent element further includes a buffer layer and a metal thin film between the organic light-emitting layer and the organic electron transport layer. The buffer layer includes an electrically-conductive organic material. The metal thin film includes a metal or a metal alloy. The metal in the metal thin film is the same as the metal doped in the organic electron transport layer. The metal alloy in the metal thin film includes a metal that is the same as the metal doped in the organic electron transport layer.

An organic electroluminescent element according to one embodiment of the disclosure includes a first electrode, an organic light-emitting layer, an organic electron injection layer doped with a metal, and a second electrode, in this order. The organic electroluminescent element further includes a buffer layer and a metal thin film between the organic light-emitting layer and the organic electron injection layer. The buffer layer includes an electrically-conductive organic material. The metal thin film includes a metal or a metal alloy. The metal in the metal thin film is the same as the metal doped in the organic electron injection layer. The metal alloy in the metal thin film includes a metal that is the same as the metal doped in the organic electron injection layer.

An organic electroluminescent unit according to one embodiment of the disclosure includes a light-emitting panel and a driving circuit. The light-emitting panel includes a plurality of organic electroluminescent elements. The driving circuit is configured to drive each of the plurality of organic electroluminescent elements. At least one of the plurality of organic electroluminescent elements includes, in order, a first electrode, an organic light-emitting layer, a buffer layer that includes an electrically-conductive organic material, a metal thin film, an organic electron transport layer doped with a metal, and a second electrode. The metal thin film includes a metal or a metal alloy. The metal in the metal thin film is the same as the metal doped in the organic electron transport layer. The metal alloy in the metal thin film includes a metal that is the same as the metal doped in the organic electron transport layer.

An electronic apparatus according to one embodiment of the disclosure includes a light-emitting panel and a driving circuit. The light-emitting panel includes a plurality of organic electroluminescent elements. The driving circuit is configured to drive each of the plurality of organic electroluminescent elements. At least one of the plurality of organic electroluminescent elements includes, in order, a first electrode, an organic light-emitting layer, a buffer layer, a metal thin film, an organic electron transport layer doped with a metal, and a second electrode. The buffer layer includes an electrically-conductive organic material. The metal thin film includes a metal or a metal alloy. The metal in the metal thin film is the same as the metal doped in the organic electron transport layer. The metal alloy in the metal thin film includes a metal that is the same as the metal doped in the organic electron transport layer.

BRIEF DESCRIPTION OF THE DRAWINGS

The accompanying drawings are included to provide a further understanding of the disclosure and are incorporated in and constitute a part of this specification. The drawings illustrate example embodiments and, together with the specification, serve to explain the principles of the disclosure.

DETAILED DESCRIPTION

Figure 1:
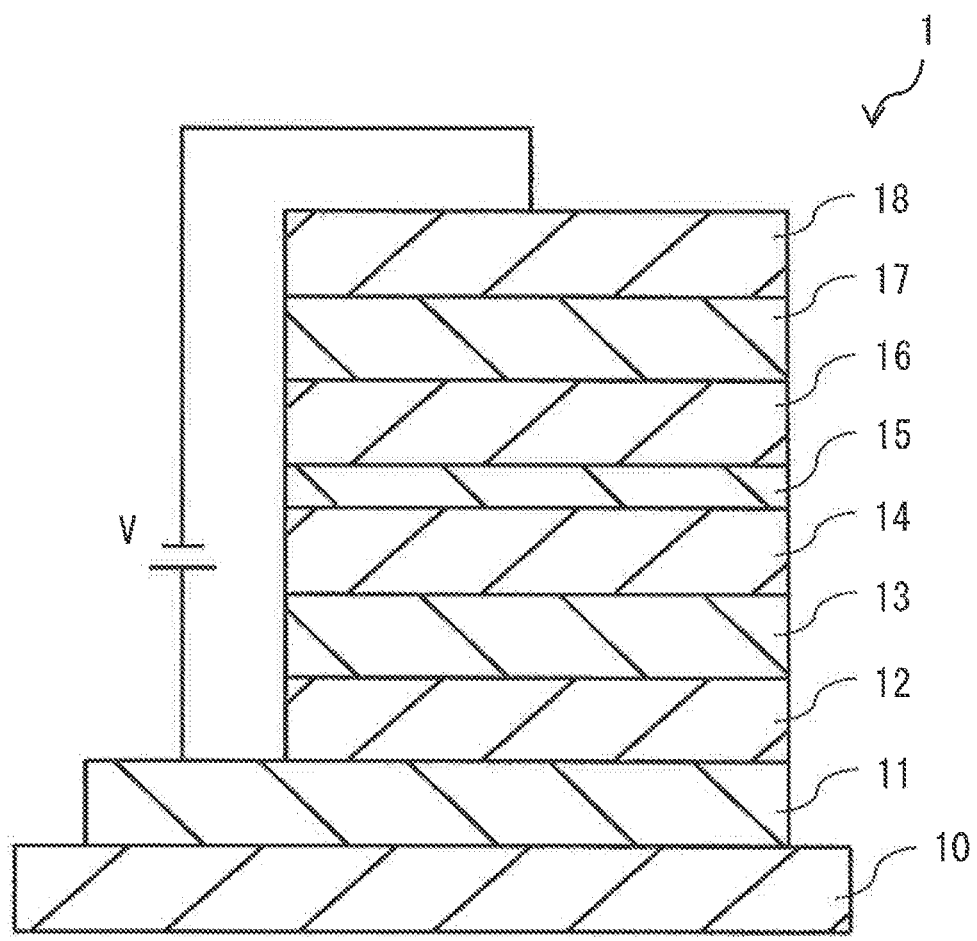
FIG. 1 illustrates an exemplary cross-sectional configuration of an organic electroluminescent element according to one embodiment of the disclosure.

In the following, some example embodiments of the disclosure are described in detail, in the following order, with reference to the accompanying drawings. Note that the following description is directed to illustrative examples of the disclosure and not to be construed as limiting to the disclosure. Factors including, without limitation, numerical values, shapes, materials, components, positions of the components, and how the components are coupled to each other are illustrative only and not to be construed as limiting to the disclosure. Further, elements in the following example embodiments which are not recited in a most-generic independent claim of the disclosure are optional and may be provided on an as-needed basis. The drawings are schematic and are not intended to be drawn to scale. Note that the like elements are denoted with the same reference numerals, and any redundant description thereof will not be described in detail. Note that the description is given in the following order.

1. First Embodiment (Organic Electroluminescent Element)
2. Modification Example of First Embodiment (Organic Electroluminescent Element)
3. Second Embodiment (Organic Electroluminescent Unit)
4. Application Examples (Electronic Apparatus and Illumination Apparatus)

1. First Embodiment

[Configuration]

FIG. 1 illustrates an exemplary cross-sectional configuration of an organic electroluminescent element 1 according to a first embodiment of the disclosure. The organic electroluminescent element 1 may be on a substrate 10, for example. The organic electroluminescent element 1 includes an anode 11, a light-emitting layer 14, and a cathode 18, for example. The light-emitting layer 14 is disposed between the anode 11 and the cathode 18. The organic electroluminescent element 1 further includes, for example, a hole injection layer 12 and a hole transport layer 13, in this order from the anode 11. The hole injection layer 12 and the hole transport layer 13 are disposed between the anode 11 and the light-emitting layer 14. One of the hole injection layer 12 or the hole transport layer 13 may be omitted. The organic electroluminescent element 1 further includes, for example, an electron transport layer 16 and an electron injection layer 17, in this order from the light-emitting layer 14. The electron transport layer 16 and the electron injection layer 17 are disposed between the light-emitting layer 14 and the cathode 18. One of the electron transport layer 16 or the electron injection layer 17 may be omitted. The organic electroluminescent element 1 further includes, for example, a diffusion barrier layer 15 between the light-emitting layer 14 and the electron transport layer 16. The diffusion barrier layer 15 may include no organic material. The organic electroluminescent element 1 has a structure that includes, for example, the anode 11, the hole injection layer 12, the hole transport layer 13, the light-emitting layer 14, the diffusion barrier layer 15, the electron transport layer 16, the electron injection layer 17, and the cathode 18, in this order from the substrate 10. Optionally, the organic electroluminescent element 1 may further include other functional layers.

The substrate 10 may be, for example, a light-transmissive translucent substrate such as a transparent substrate. The substrate 10 may be, for example but not limited to, a glass substrate including a glass material. In an exemplary embodiment, the substrate 10 may be a translucent resin substrate including a translucent resin material, such as polycarbonate resin or acrylic resin. In an exemplary embodiment, the substrate 10 may be a thin-film transistor (TFT) substrate that is to be a backplane of an organic electroluminescent (EL) display unit.

The anode 11 may be on the substrate 10, for example. The anode 11 may be, for example but not limited to, a transparent electrode having translucency. In an exemplary embodiment, the anode 11 may be a transparent electrically-conductive film including a transparent electrically-conductive material, such as indium tin oxide (ITO) or indium zinc oxide (IZO). In an exemplary embodiment, the anode 11 may be an electrode including aluminum (Al), silver (Ag), an aluminum alloy, or a silver alloy. In an exemplary embodiment, the anode 11 may be a reflective electrode having light reflectivity. In an exemplary embodiment, the anode 11 may be a laminate of the reflective electrode and the transparent electrode.

The hole injection layer 12 may inject, to the hole transport layer 13 and the light-emitting layer 14, holes injected from the anode 11. The hole injection layer 12 may include, for example, a material (hereinafter referred to as hole injecting material) that facilitates the injection of the holes from the anode 11 into the hole transport layer 13 and the light-emitting layer 14. Non-limiting examples of the hole injecting material may include oxides of silver (Ag), molybdenum (Mo), chromium (Cr), vanadium (V), tungsten (W), nickel (Ni), and iridium (Ir), and electrically-conductive polymeric materials, such as a mixture of polythiophene and polystyrene sulfonate (PEDOT).

The hole transport layer 13 may transport, to the light-emitting layer 14, holes injected from the anode 11. The hole transport layer 13 may include, for example, a material (hereinafter referred to as hole transporting material) that transports, to the light-emitting layer 14, holes injected from the anode 11. Non-limiting examples of the hole transporting material may include an arylamine derivative, a triazole derivative, an oxadiazole derivative, an imidazole derivative, a polyarylalkane derivative, a pyrazoline derivative, a pyrazolone derivative, a phenylenediamine derivative, an amino-substituted chalcone derivative, an oxazole derivative, a styrylanthracene derivative, a fluorenone derivative, a hydrazone derivative, a stilbene derivative, a butadiene compound, a polystyrene derivative, a triphenylmethane derivative, a tetraphenylbenzene derivative, and a combination thereof.

The light-emitting layer 14 may emit fluorescent light in a predetermined color through recombination of holes and electrons. For example, the light-emitting layer 14 may be a coated film that is coated with a solution by application and drying of the solution. The solution may contain an organic light-emitting material as a solute, and a solvent. In an exemplary embodiment, the light-emitting layer 14 may be a deposited film.

The light-emitting layer 14 may emit light through generation of excitons caused by recombination of holes and electrons in the light-emitting layer 14. The holes are injected from the anode 11, and the electrons are injected from the cathode 18. The light-emitting layer 14 may include an organic light-emitting material, for example. The organic light-emitting material or the raw material of the light-emitting layer 14 may be, for example but not limited to, a combination of a host material and a fluorescent dopant material. In other words, the light-emitting layer 14 may include, as the organic light-emitting material, the host material and the fluorescent dopant material, for example. The host material may mainly serve to transport charges, such as electrons and holes, and the fluorescent dopant material may serve to emit fluorescent light. In an exemplary embodiment, the organic light-emitting material may be a combination of two or more host materials and two or more fluorescent dopant materials.

Non-limiting examples of the host material of the light-emitting layer 14 may include an amine compound, a condensed polycyclic aromatic compound, and a heterocyclic compound. Non-limiting examples of the amine compound may include a monoamine derivative, a diamine derivative, a triamine derivative, and a tetraamine derivative. Non-limiting examples of the condensed polycyclic aromatic compound may include an anthracene derivative, a naphthalene derivative, a naphthacene derivative, a phenanthrene derivative, a chrysene derivative, a fluoranthene derivative, a triphenylene derivative, a pentacene derivative, and a perylene derivative. Non-limiting examples of the heterocyclic compound may include a carbazole derivative, a furan derivative, a pyridine derivative, a pyrimidine derivative, a triazine derivative, an imidazole derivative, a pyrazole derivative, a triazole derivative, an oxazole derivative, an oxadiazole derivative, a pyrrole derivative, an indole derivative, an azaindole derivative, an azacarbazole derivative, a pyrazoline derivative, a pyrazolone derivative, and a phthalocyanine derivative.

Non-limiting examples of the fluorescent dopant material of the light-emitting layer 14 may include a pyrene derivative, a fluoranthene derivative, an arylacetylene derivative, a fluorene derivative, a perylene derivative, an oxadiazole derivative, an anthracene derivative, and a chrysene derivative. In an exemplary embodiment, the fluorescent dopant material of the light-emitting layer 14 may be a metal complex. The metal complex may contain a ligand and atom of metal, such as iridium (Ir), platinum (Pt), osmium (Os), gold (Au), rhenium (Re), or ruthenium (Ru).

The electron transport layer 16 may transport, to the light-emitting layer 14, electrons injected from the cathode 18. The electron transport layer 16 may include, for example, a material (hereinafter referred to as electron transporting material) that transport, to the light-emitting layer 14, electrons injected from the cathode 18. The electron transport layer 16 may be a deposited film, for example.

In an exemplary embodiment, the electron transport layer 16 may further have a charge-blocking property to suppress tunneling of charges (i.e., holes in the present embodiment) from the light-emitting layer 14 to the cathode 18. The electron transport layer 16 may have a property to suppress light extinction of the light-emitting layer 14 in an excitation state.

The electron transporting material may be an aromatic heterocyclic compound containing one or more hetero atoms in a molecule, for example. The aromatic heterocyclic compound may include, as a skeleton, a pyridine ring, a pyrimidine ring, a triazine ring, a benzimidazole ring, a phenanthroline ring, or a quinazoline ring, for example. In an exemplary embodiment, the electron transporting material may be doped with a metal having an electron transporting property. The electron transport layer 16 of the exemplary embodiment may be an organic electron transport layer doped with the metal. The electron transport layer 16 including the metal having the electron transporting property makes it possible to exhibit an enhanced electron transporting property. Non-limiting examples of the metal doped in the electron transport layer 16 may include transition metals, such as ytterbium (Yb).

The electron injection layer 17 may inject, into the electron transport layer 16 and the light-emitting layer 14, electrons injected from the cathode 18. The electron injection layer 17 may include a material (hereinafter referred to as electron injecting material) that facilitates the injection of electrons from the cathode 18 to the electron transport layer 16 and the light-emitting layer 14. In an exemplary embodiment, the electron injecting material may be an organic material having an electron injecting property and doped with a metal having an electron injecting property. The electron injection layer 17 of the exemplary embodiment may be an organic electron injection layer doped with the metal. The metal doped in the electron injection layer 17 may be the same as the metal doped in the electron transport layer 16, for example. Non-limiting examples of the metal doped in the electron injection layer 17 may include transition metals, such as ytterbium (Yb). In the exemplary embodiment, the metal doped in the (organic) electron transport layer 16 may be less in amount than the (organic) electron injection layer 17. This helps to reduce the diffusion of the metal into the light-emitting layer 14 and suppress a reduction in the transmittance of the electron transport layer 16 and a reduction in light emission efficiency, compared with a case where the metal doped in the electron transport layer 16 is the same in amount as the metal doped in the electron injection layer 17. The amount of the metal doped in the (organic) electron transport layer 16 may be 15 wt %, for example. In an exemplary embodiment, the amount of the metal doped in the (organic) electron transport layer 16 may be 5 wt % in view of suppressing the diffusion of the metal and a reduction in transmittance. In an exemplary embodiment, the electron injection layer 17 may be a metal thin film that includes a metal that is the same as the metal doped in the electron transport layer 16.

Regardless of whether the electron injection layer 17 is the organic electron injection layer doped with the metal that is the same as the metal doped in the electron transport layer 16 or the metal thin film including the metal that is the same as the metal doped in the electron transport layer 16, the electron injection layer 17 may be less in thickness than the electron transport layer 16. In an exemplary embodiment, the electron transport layer 16 may have a thickness greater than 15 nm, and the electron injection layer 17 may have a thickness of 15 nm or less. Note that electron transport layer 16 thicker than the electron injection layer 17 is less likely to affect a driving voltage of the organic electroluminescent element 1, because the electron transport layer 16 may be an electrically-conductive layer doped with the metal.

The cathode 18 may be, for example but not limited to, a reflective electrode having light reflectivity. In an exemplary embodiment, the cathode 18 may be a metal electrode that includes a metal material having light reflectivity. Non-limiting examples of the metal material of the cathode 18 may include aluminum (Al), magnesium (Mg), silver (Ag), an aluminum-lithium alloy, and a magnesium-silver alloy. In an exemplary embodiment, the cathode 18 may be a transparent electrode, such as an ITO film. In the present embodiment, the substrate 10 and the anode 11 may have translucency, and the cathode 18 may have light reflectivity. In this case, the organic electroluminescent element 1 may have a bottom-emission structure that emits light through the substrate 10. Conversely, the substrate 10 and the anode 11 may have light reflectivity, and the cathode 18 may have translucency in the present embodiment. In this case, the organic electroluminescent element 1 may have a top-emission structure that emits light through the cathode 18.

The diffusion barrier layer 15 is described in detail below. The diffusion barrier layer 15 may suppress diffusion, into the light-emitting layer 14, of the metal doped in the electron transport layer 16 or the electron injection layer 17. The diffusion barrier layer 15 is disposed between the light-emitting layer 14 and the electron transport layer 16 or between the light-emitting layer 14 and the electron injection layer 17. The diffusion barrier layer 15 may be in contact with the electron transport layer 16 in an exemplary embodiment where the electron transport layer 16 is provided. The diffusion barrier layer 15 may be in contact with the electron injection layer 17 in an exemplary embodiment where the electron transport layer 16 is omitted.

In an exemplary embodiment, the diffusion barrier layer 15 is a metal thin film that includes a metal that is the same as the metal doped in the electron transport layer 16 or the electron injection layer 17. The metal may be a transition metal, such as Yb. In an exemplary embodiment, the diffusion barrier layer 15 is a metal thin film that includes a metal alloy including a metal that is the same as the metal doped in the electron transport layer 16 or the electron injection layer 17. The metal alloy may be a transition metal alloy, such as YbIn. The metal thin film may have a thickness in a range from 0.1 nm to 2 nm, for example. A metal film having a thickness greater than 2 nm may possibly reduce the transmittance of light passing through the diffusion barrier layer 15. A metal thin film having a thickness less than 0.1 nm may possibly exhibit lower efficiency in suppressing the diffusion, into the light-emitting layer 14, of the metal doped in the electron transport layer 16 or the electron injection layer 17.

[Effects]

Described below are some effects of the organic electroluminescent element 1 of the present embodiment.

A variety of organic electroluminescent units including organic electroluminescent elements have been proposed. The organic electroluminescent elements each generate excitons through recombination of electrons and holes, in a light-emitting layer. The electrons are injected from a cathode and the holes are injected from an anode. The organic electroluminescent element emits light when the excitons return to a low energy level or a ground state. Accordingly, efficient carrier injection is needed for the organic electroluminescent element.

Electron injection is one of techniques for carrier injection. For the electron injection, an electron injection layer is used as an organic layer through which electrons are injected into a light-emitting layer. The electron injection layer includes an organic material doped with a low-work function metal. Unfortunately, the use of such an electron injection layer may cause diffusion, into the light-emitting layer, of the metal doped in the electron injection layer. This may possibly lead to a reduction in light emission efficiency. To address such a concern, Nos. 2013-38432, 2014-82524, and 2015-109470 each describe a diffusion barrier layer to suppress the diffusion of the metal doped in the electron injection layer.

The diffusion barrier layers described in Nos. 2013-38432, 2014-82524, and 2015-109470 each include various organic compounds, such as a crown ether derivative, or metal salts thereof, such as fluorides. Unfortunately, these diffusion barrier layers lack stability. In particular, a diffusion barrier layer that includes a salt of an organic compound including an alkali metal or an alkaline-earth metal may readily cause the diffusion, into the light-emitting layer, of the metal in the diffusion barrier layer.

In contrast, the diffusion barrier layer 15 or the metal thin film that is disposed between the light-emitting layer 14 and the electron transport layer 16 or between the light-emitting layer 14 and the electron injection layer 17 includes a metal or a metal alloy in an exemplary embodiment of the disclosure. The metal in the diffusion barrier layer 15 is the same as the metal doped in the electron transport layer 16 or the electron injection layer 17. The metal alloy in the diffusion barrier layer 15 includes a metal that is the same as the metal doped in the electron transport layer 16 or the electron injection layer 17. Such a diffusion barrier layer 15 suppresses the diffusion, into the light-emitting layer 14, of the metal doped in the electron transport layer 16 or the electron injection layer 17. Further, the diffusion barrier layer 15 includes the metal that is the same as the metal in a layer in contact with the diffusion barrier layer 15 (i.e., the electron transport layer 16 or the electron injection layer 17). Such a diffusion barrier layer 15 hardly generates an electronic barrier between the diffusion barrier layer 15 and the layer in contact with the diffusion barrier layer 15. Moreover, even if the metal in the layer in contact with the diffusion barrier layer 15 (i.e., the electron transport layer 16 or the electron injection layer 17) is diffused in a large amount in a part adjacent to the diffusion barrier layer 15, the part adjacent to the diffusion barrier layer 15 is prevented from being defective. Furthermore, the metal in the diffusion barrier layer 15 causes substantially no abnormal reaction to the layer in contact with the diffusion barrier layer 15. Additionally, the diffusion barrier layer 15 is a significantly thin film having a thickness in a range from 0.1 nm to 2 nm, for example. Such a diffusion barrier layer 15 hardly hinders the electron injection property and hardly reduces the transmittance of light passing through the diffusion barrier layer 15. This makes it possible to suppress a reduction in light emission efficiency.

Additionally, the metal thin film (i.e., the diffusion barrier layer 15) is disposed between the light-emitting layer 14 and the electron injection layer 17. The metal thin film includes a metal or a metal alloy in an exemplary embodiment of the disclosure. The metal in the diffusion barrier layer 15 is the same as the metal in the electron injection layer 17. The metal alloy in the diffusion barrier layer 15 includes a metal that is the same as the metal in the electron injection layer 17. Such a diffusion barrier layer 15 suppresses the diffusion, into the light-emitting layer 14, of the metal in the electron injection layer 17. Further, the diffusion barrier layer 15 is a significantly thin film having a thickness in a range from 0.1 nm to 2 nm, for example. Such a diffusion barrier layer 15 hardly hinders the electron injection property and hardly reduces the transmittance of light passing through the diffusion barrier layer 15. This makes it possible to suppress a reduction in light emission efficiency.

The metal doped in the electron transport layer 16 or the electron injection layer 17 may be a transition metal, such as Yb, in an exemplary embodiment of the disclosure. This stabilizes the diffusion barrier layer 15, suppressing the diffusion, into the light-emitting layer 14, of the metal in the diffusion barrier layer 15. Accordingly, it is possible to suppress a reduction in light emission efficiency.

The electron transport layer 16 is doped with the metal in an exemplary embodiment of the disclosure. Compared with an electron transport layer doped with no metal, the electron transport layer 16 makes it possible to retain a voltage that is to be applied to the organic electroluminescent element 1 at a low level. Further, the metal doped in the electron transport layer 16 may be less in amount than the (organic) electron injection layer 17. This makes it possible to reduce the diffusion of the metal into the light-emitting layer 14 and suppress a reduction in the transmittance of the electron transport layer 16 and a reduction in light emission efficiency, compared with the case where the metal doped in the electron transport layer 16 is the same in amount as the metal doped in electron injection layer 17. Furthermore, the diffusion barrier layer 15 makes it possible to efficiently suppress the diffusion of the metal into the light-emitting layer 14. This makes it possible to suppress a reduction in light emission efficiency while retaining the driving voltage at a low level.

The electron injection layer 17 may be less in thickness than the electron transport layer 16 in an exemplary embodiment of the disclosure. For example, the electron transport layer 16 may have a thickness greater than 15 nm, and the electron injection layer 17 may have a thickness of 15 nm or less. The electron transport layer 16 thicker than the electron injection layer 17 is less likely to affect the driving voltage of the organic electroluminescent element 1, because the electron transport layer 16 may be an electrically-conductive layer doped with the metal. Accordingly, it is possible to adjust the organic electroluminescent element 1 to a high-order cavity mode by increasing the thickness of the electron transport layer 16. Therefore, it is possible to suppress a reduction in light emission efficiency even after the adjustment of the organic electroluminescent element 1 to a high order cavity mode.

2. Modification Example of First Embodiment

Modification Example A

In the foregoing embodiments, increasing the thickness of the diffusion barrier layer 15 helps to sufficiently suppress the diffusion of the metal, whereas readily impairing transmittance and light emission efficiency. Additionally, reducing the thickness of the diffusion barrier layer 15 may possibly impair the diffusion barrier property of the diffusion barrier layer 15, whereas helping to increase the transmittance of the diffusion barrier layer 15 and the light emission efficiency. In this way, the transmittance and the light emission efficiency are in a tradeoff relation. Further, the diffusion barrier layer 15 may be in direct contact with the light-emitting layer 14 in the foregoing embodiments. This may possibly cause light extinction and minor diffusion, into the light-emitting layer 14, of the metal in the diffusion barrier layer 15.

Figure 2:
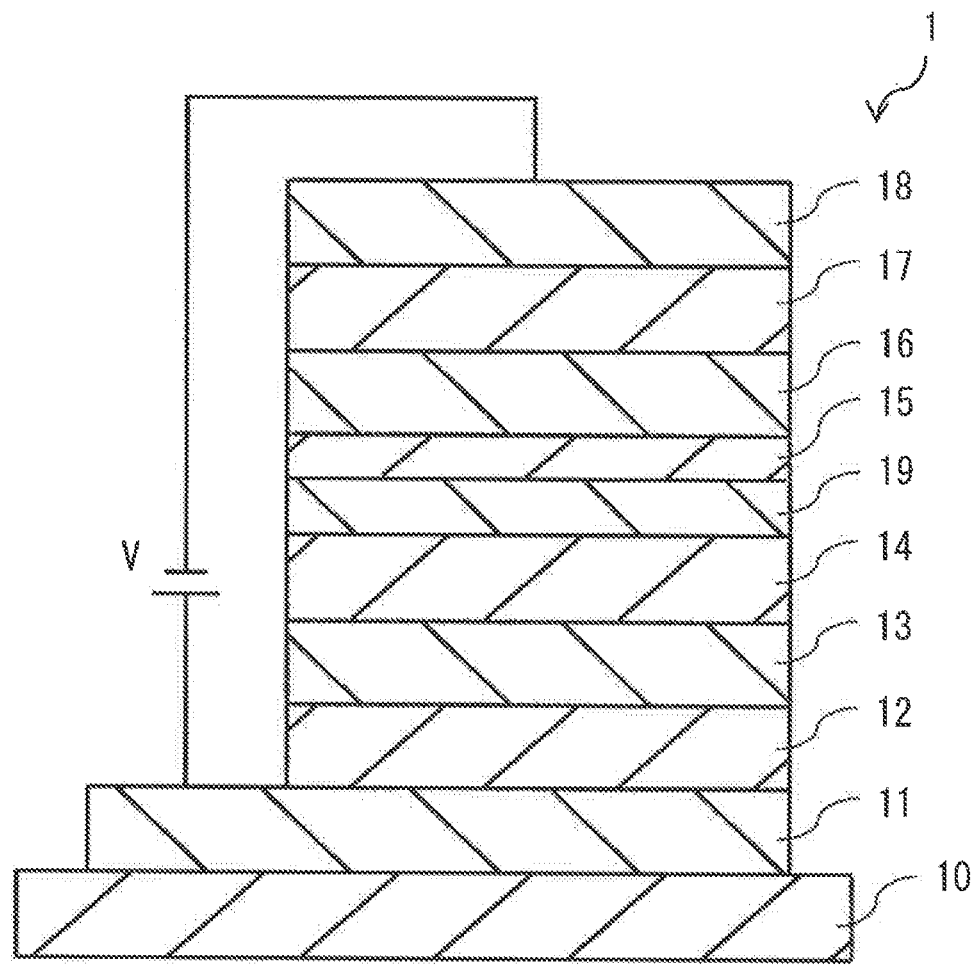
FIG. 2 illustrates a modification example of a cross-sectional configuration of an organic electroluminescent element illustrated in FIG. 1.

To address such concerns, the organic electroluminescent element 1 of an exemplary embodiment of the disclosure may further include a buffer layer 19 between the light-emitting layer 14 and the diffusion barrier layer 15, as illustrated in FIG. 2, for example. The buffer layer 19 may include an electrically-conductive organic material. Note that one of the hole injection layer 12 or the hole transport layer 13 illustrated in FIG. 2 may be omitted, and one of the electron transport layer 16 or the electron injection layer 17 illustrated in FIG. 2 may be omitted. In an exemplary embodiment, the buffer layer 19 may be in contact with the light-emitting layer 14. In an exemplary embodiment, the buffer layer 19 may be in non-contact with the light-emitting layer 14.

The buffer layer 19 may prevent a direct contact between the light-emitting layer 14 and the diffusion barrier layer 15. The buffer layer 19 may be disposed between the light-emitting layer 14 and the electron transport layer 16 or between the light-emitting layer 14 and the electron injection layer 17. The buffer layer 19 may be disposed closer to the light-emitting layer 14 than the diffusion barrier layer 15. The buffer layer 19 may also serve as a hole-blocking layer. The buffer layer 19 may include, for example, a π-electron system low molecular organic material, such as an oxadiazole derivative (OXD), a triazole derivative (TAZ), or a phenanthroline derivative (BCP, Bphen).

Figure 3:
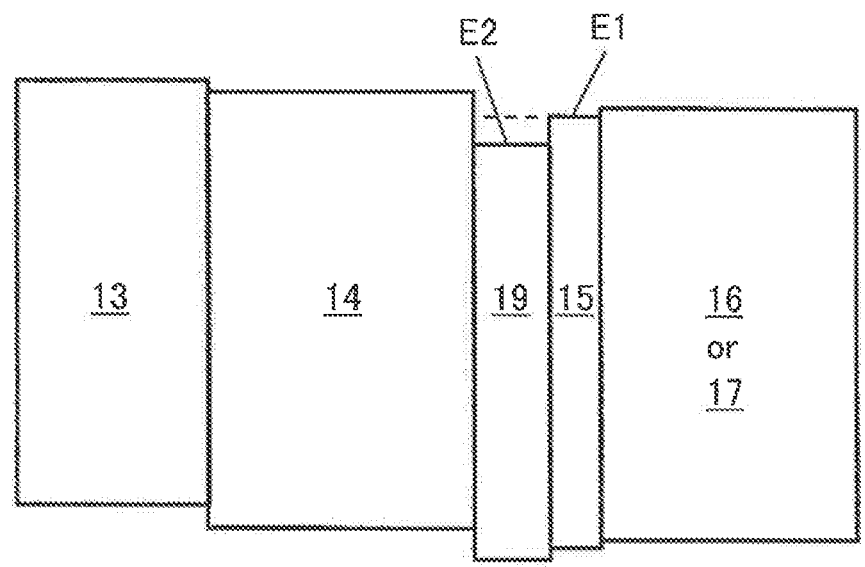
FIG. 3 schematically illustrates exemplary energy levels of respective layers of an organic electroluminescent element illustrated in FIG. 2.

FIG. 3 schematically illustrates exemplary energy levels of the respective layers of the organic electroluminescent element 1 of the present modification example.

The upper line of each layer including an organic material indicates the lowest unoccupied molecular orbital (LUMO), and the lower line indicates the highest occupied molecular orbital (HOMO). In FIG. 3, E1 represents the work function of the diffusion barrier layer 15, and E2 represents the LUMO energy level of the buffer layer 19. As illustrated in FIG. 3, E2 may be lower than E1, and E1 and E2 may satisfy the following expression.

$$|E1-E2|>0 \qquad \text{Expression (1)}$$

In an exemplary embodiment, E1 and E2 may further satisfy the following expression.

$$0<|E1-E2|<0.6 \text{ eV} \qquad \text{Expression (2)}$$

E1 and E2 that are excessively close to each other may cause overlapping of electron orbitals, forming metal complexes in the buffer layer 19. The metal complexes formed in the buffer layer 19 may diffuse into the light-emitting layer 14, possibly resulting in a reduction in light emission efficiency. Accordingly, the buffer layer 19 may include an organic material that is free from forming a metal complex even when the buffer layer 19 is in contact with the diffusion barrier layer 15. Additionally, E1 and E2 that are excessively close to each other may readily cause light extinction. Conversely, E1 and E2 that are excessively far from each other may increase the driving voltage of the organic electroluminescent element 1 to an excessively high level. For example, if the difference between E1 and E2 is 0.6 eV or greater, the driving voltage of the organic electroluminescent element 1 may be several volts. To retain the driving voltage at around one volt or less, E1 and E2 may satisfy the following expression.

$$0.2<|E1-E2|<0.4 \text{ eV} \qquad \text{Expression (3)}$$

In an exemplary embodiment, |E1-E2| may be 0.3 eV.

In the present modification example, the diffusion barrier layer 15 and the buffer layer 19 may be disposed between the light-emitting layer 14 and the electron transport layer 16 or between the light-emitting layer 14 and the electron injection layer 17. The diffusion barrier layer 15 may be thinner than the buffer layer 19 and the buffer layer 19 may be thicker than the diffusion barrier layer 15. This makes it possible to efficiently suppress the diffusion of the metal and sufficiently increase the transmittance of the diffusion barrier layer 15 and the buffer layer 19. In the present modification example, the diffusion barrier layer 15 may be in non-contact with the light-emitting layer 14, and E1 and E2 may satisfy Expression (1), and optionally Expressions (2) and (3). This reduces occurrence of light extinction and suppresses or prevents the diffusion, into the light-emitting layer 14, of the metal in the diffusion barrier layer 15. Consequently, it is possible to suppress a reduction in light emission efficiency while retaining the driving voltage at a low level.

Figure 4:
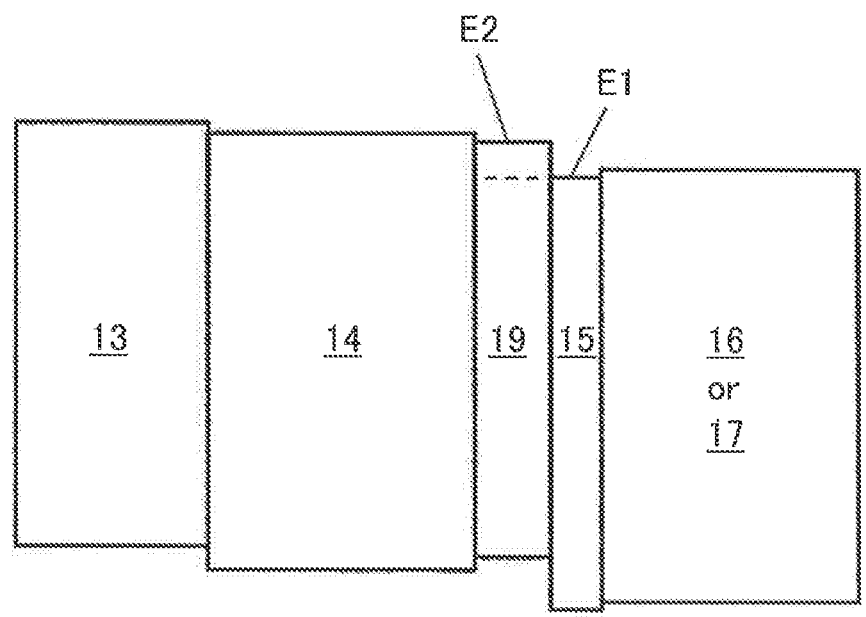
FIG. 4 schematically illustrates a modification example of energy levels of respective layers of an organic electroluminescent element illustrated in FIG. 2.

In another modification example, E2 may be higher than E1, as illustrated in FIG. 4, and E1 and E2 may satisfy Expression (1) described above.

Modification Example B

Figure 5:
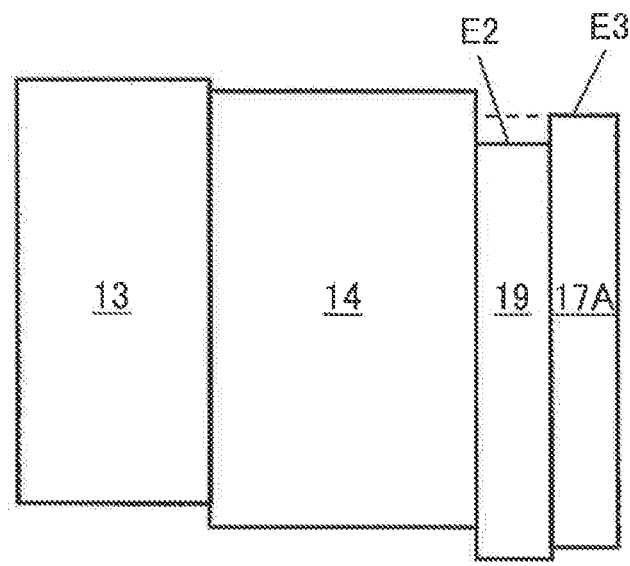
FIG. 5 schematically illustrates a modification example of energy levels of respective layers of an organic electroluminescent element illustrated in FIG. 2.
Figure 6:
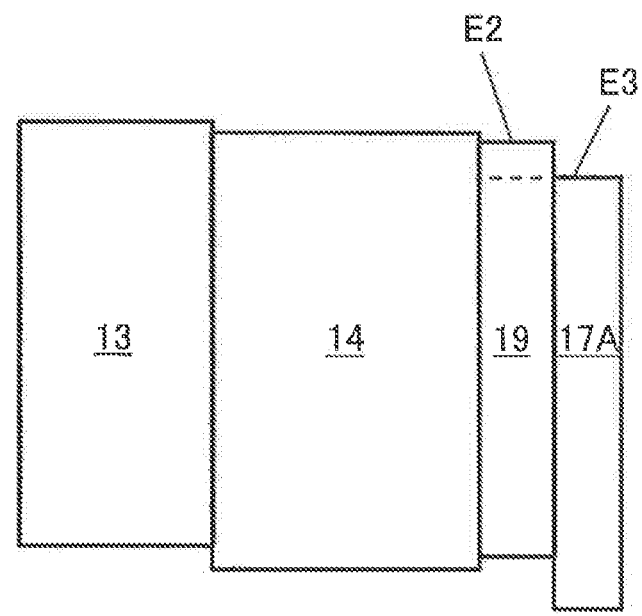
FIG. 6 schematically illustrates a modification example of energy levels of respective layers of an organic electroluminescent element illustrated in FIG. 2.

In the modification example A, the diffusion barrier layer 15, the electron transport layer, and the electron injection layer 17 may be omitted. In an exemplary embodiment, an electron injection layer 17A may be alternatively provided, as illustrated in FIGS. 5 and 6. The electron injection layer 17A may be in contact with a face of the buffer layer 19. The face of the buffer layer 19 may be located on the side opposite to the light-emitting layer 14. In an exemplary embodiment, the electron injection layer 17A may be in contact with the cathode 18. In an exemplary embodiment, any layer may be provided between the electron injection layer 17A and the cathode 18. In an exemplary embodiment, the electron injection layer 17A may be a metal thin film including a metal alloy. Non-limiting examples of the metal included in the electron injection layer 17A may include transition metals, such as ytterbium (Yb). The electron injection layer 17A suppresses the diffusion, into the light-emitting layer 14, of the metal included in the cathode 18. The metal thin film may have a thickness in a range from 0.1 nm to 2 nm, for example. A metal thin film having a thickness greater than 2 nm may possibly reduce the transmittance of light passing through the electron injection layer 17A. A metal thin film having a thickness less than 0.1 nm may possibly exhibit lower efficiency in suppressing the diffusion, into the light-emitting layer 14, of the metal doped included in the cathode 18.

As illustrated in FIGS. 5 and 6, E2 may be lower than E3, and E2 and E3 satisfy the following expression.

$$|E3-E2|>0 \qquad \text{Expression (4)}$$

In an exemplary embodiment, E2 and E3 may further satisfy the following expression.

$$0<|E3-E2|<0.6 \text{ eV} \qquad \text{Expression (5)}$$

In an exemplary embodiment, E3 may be the minimum value among the work functions of the metals included in other layers, excluding the anode 11 and the cathode 18, in the organic electroluminescent element 1.

E2 and E3 that are excessively close to each other may cause overlapping of electron orbitals, possibly leading to the formation of metal complexes in the buffer layer 19. The metal complexes formed in the buffer layer 19 may diffuse into the light-emitting layer 14, possibly resulting in a reduction in light-emitting efficiency. Accordingly, the buffer layer 19 may include an organic material that is free from forming a metal complex even when the buffer layer 19 is in contact with the electron injection layer 17A. Additionally, E2 and E3 that are excessively close to each other may possibly cause light extinction readily. Conversely, E2 and E3 that are excessively far from each other may increase the driving voltage of the organic electroluminescent element 1 to an excessively high level. For example, if the difference between E2 and E3 is 0.6 eV or greater, the driving voltage of the organic electroluminescent element 1 may be several volts. To retain the driving voltage at around one volt or less, E2 and E3 may satisfy the following expression.

$$0.2<|E3-E2|<0.4 \text{ eV} \qquad \text{Expression (6)}$$

In an exemplary embodiment, |E3−E2| may be 0.3 eV.

In the present modification example, the electron injection layer 17A may be provided between the light-emitting layer 14 and the cathode 18. This allows the electron injection layer 17A to be thinner than the buffer layer 19 and the buffer layer 19 to be thicker than the electron injection layer 17A. This makes it possible to efficiently suppress the diffusion of the metal and sufficiently increase the transmittance of the electron injection layer 17A and the buffer layer 19. In the present modification example, the electron injection layer 17A may be in non-direct contact with the light-emitting layer 14, and E2 and E3 may satisfy Expression (4), and optionally Expressions (5) and (6). This reduces occurrence of light extinction and suppresses or prevents the diffusion, into the light-emitting layer 14, of the metal in the electron injection layer 17A. Consequently, it is possible to suppress a reduction in light emission efficiency while retaining the driving voltage at a low level.

Modification Example C

Figure 7:
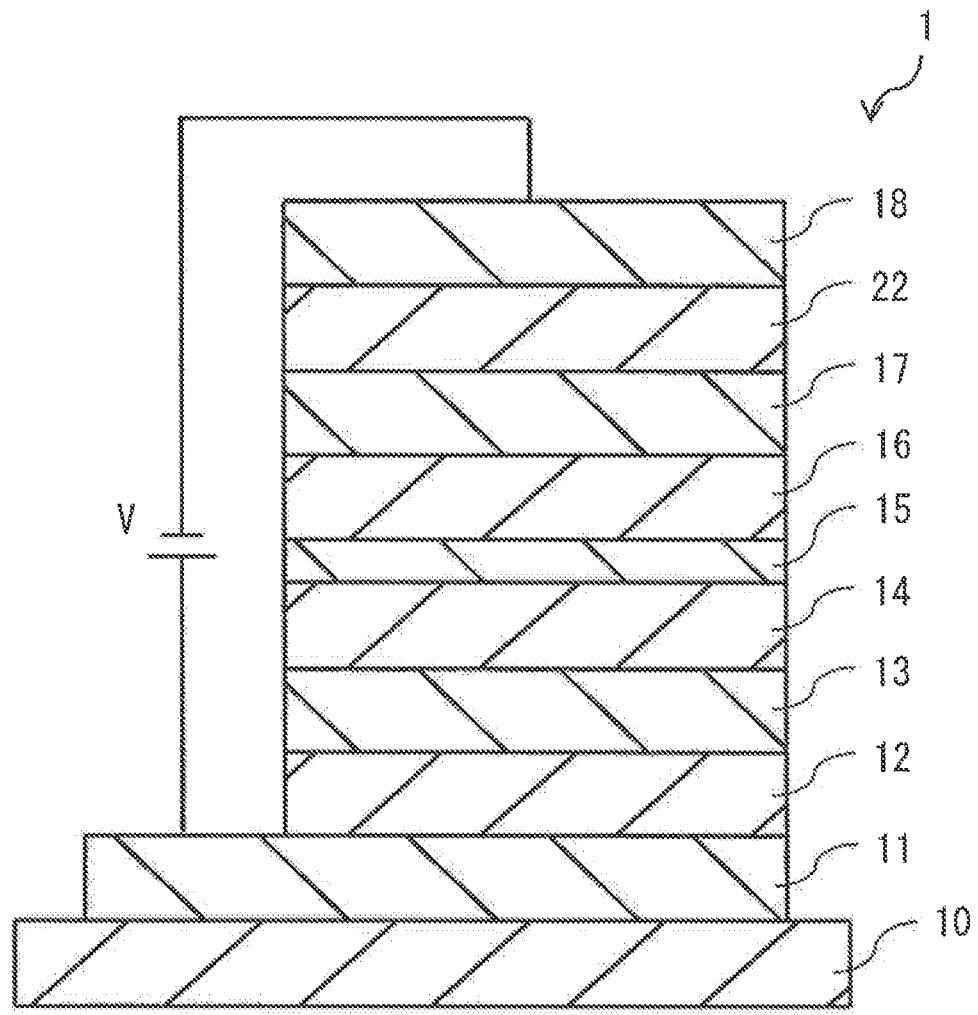
FIG. 7 illustrates a modification example of a cross-sectional configuration of an organic electroluminescent element illustrated in FIG. 1.
Figure 8:
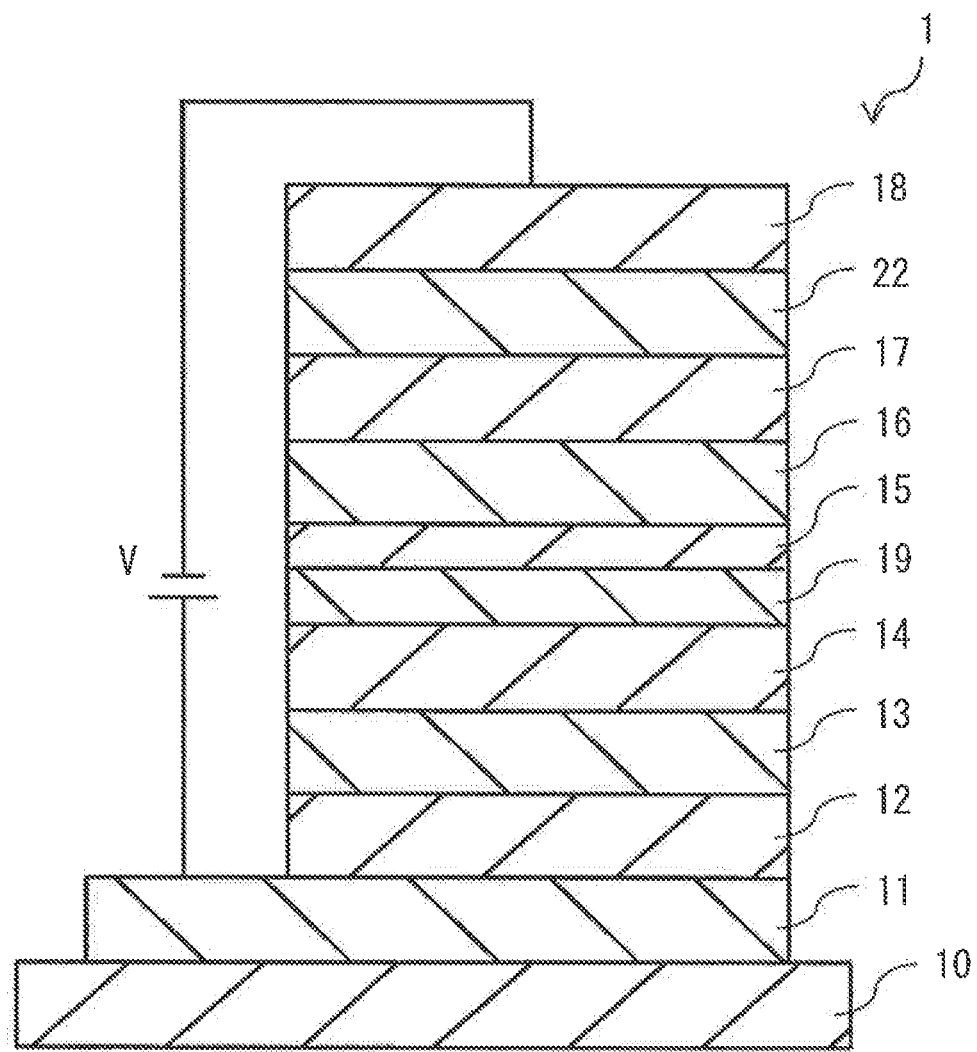
FIG. 8 illustrates a modification example of a cross-sectional configuration of an organic electroluminescent element illustrated in FIG. 2.
Figure 9:
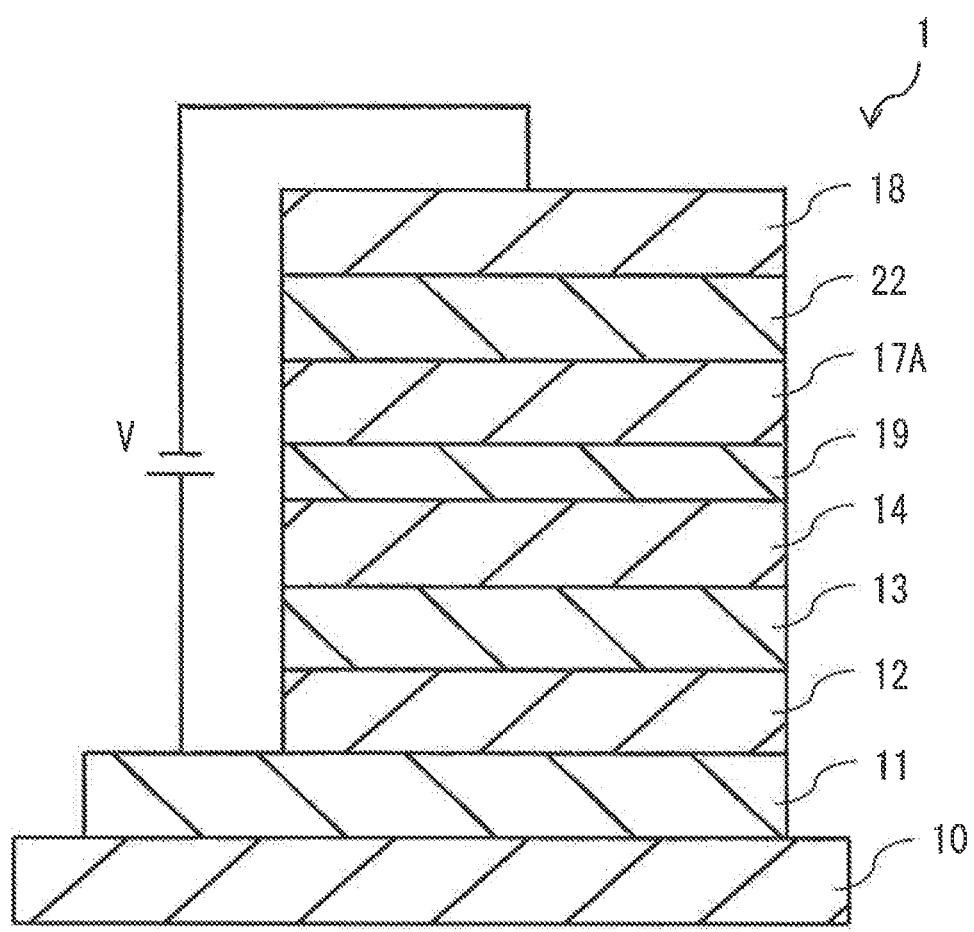
FIG. 9 illustrates a modification example of a cross-sectional configuration of an organic electroluminescent element illustrated in FIGS. 5 and 6.

The organic electroluminescent element 1 of an exemplary embodiment of the disclosure may further include a film-thickness adjusting layer 22, as illustrated in FIGS. 7, 8, and 9, for example. The film-thickness adjusting layer 22 may be in contact with a side of the cathode 18. The side of the cathode 18 may be closer to the light-emitting layer 14 than the other side of the cathode 18. In an exemplary embodiment where both of the electron transport layer 16 and the electron injection layer 17 are provided in the organic electroluminescent element 1, the film-thickness adjusting layer 22 may also be in contact with the electron injection layer 17. In an exemplary embodiment where the electron injection layer 17 is omitted and the electron transport layer 16 is provided, the film-thickness adjusting layer 22 may also be in contact with the electron transport layer 16. In an exemplary embodiment where the electron injection layer 17A is provided, the film-thickness adjusting layer 22 may also be in contact with the electron injection layer 17A.

The film-thickness adjusting layer 22 may adjust the distance between the anode 11 and the cathode 18 to a predetermined optical path length. The film-thickness adjusting layer 22 may include, for example, a transparent electrically-conductive material, such as ITO or IZO. The film-thickness adjusting layer 22 may be an ITO layer or an IZO layer, for example. These materials, ITO and IZO, are highly transparent and low-resistive materials. The ITO or IZO layer used as the film-thickness adjusting layer 22 may have a thickness greater than 15 nm, for example.

The use of the film-thickness adjusting layer 22 enables an adjustment of the optical path length to any value. This helps to improve light extraction efficiency. In general, the ITO or IZO layer may be formed by sputtering. During the sputtering, an underlayer of the ITO or IZO layer may possibly be damaged, causing short-circuiting, leakage, a reduction in light emission efficiency, an increase in driving voltage, or any other degradation in organic electroluminescent characteristics. A possible solution to suppress the sputtering damage and the degradation in organic electroluminescent characteristics is the use of an underlayer including, for example, an organic material doped with a low-work function metal for the formation of the ITO or IZO layer.

In the present modification example, the electron transport layer 16, the electron injection layer 17, or the electron injection layer 17A may serve as the underlayer of the film-thickness adjusting layer 22. In detail, the electron transport layer 16, the electron injection layer 17, or the electron injection layer 17A that includes an organic material doped with a metal makes it possible to improve light extraction efficiency, while suppressing the degradation in organic electroluminescent characteristics. In an exemplary embodiment, the diffusion barrier layer 15 may be disposed between the light-emitting layer 14 and the film-thickness adjusting layer 22. In such an exemplary embodiment, if the electron transport layer 16, the electron injection layer 17, or the electron injection layer 17A may include the organic material doped with a metal, and the diffusion barrier layer 15 may be a metal thin film that includes a metal that is the same as the metal doped in the electron transport layer 16, the electron injection layer 17, or the electron injection layer 17A, or a metal alloy including a metal that is the same as the metal doped in the electron transport layer 16, the electron injection layer 17, or the electron injection layer 17A, such a diffusion barrier layer 15 suppresses the diffusion, into the light-emitting layer 14, of the metal doped in the electron transport layer 16, the electron injection layer 17, or the electron injection layer 17A. This makes it possible to suppress a reduction in light emission efficiency due to the damage on the underlayer (i.e., the electron transport layer 16, the electron injection layer 17, or the electron injection layer 17A) of the film-thickness adjusting layer 22. As described hereinabove, the film-thickness adjusting layer 22 makes it possible to improve light extraction efficiency, the electron transport layer 16, the electron injection layer 17, or the electron injection layer 17A makes it possible to suppress the degradation in organic electroluminescent characteristics, and the diffusion barrier layer 15 makes it possible to suppress a reduction in light emission efficiency, in the present modification example.

3. Second Embodiment

[Configuration]

Figure 10:
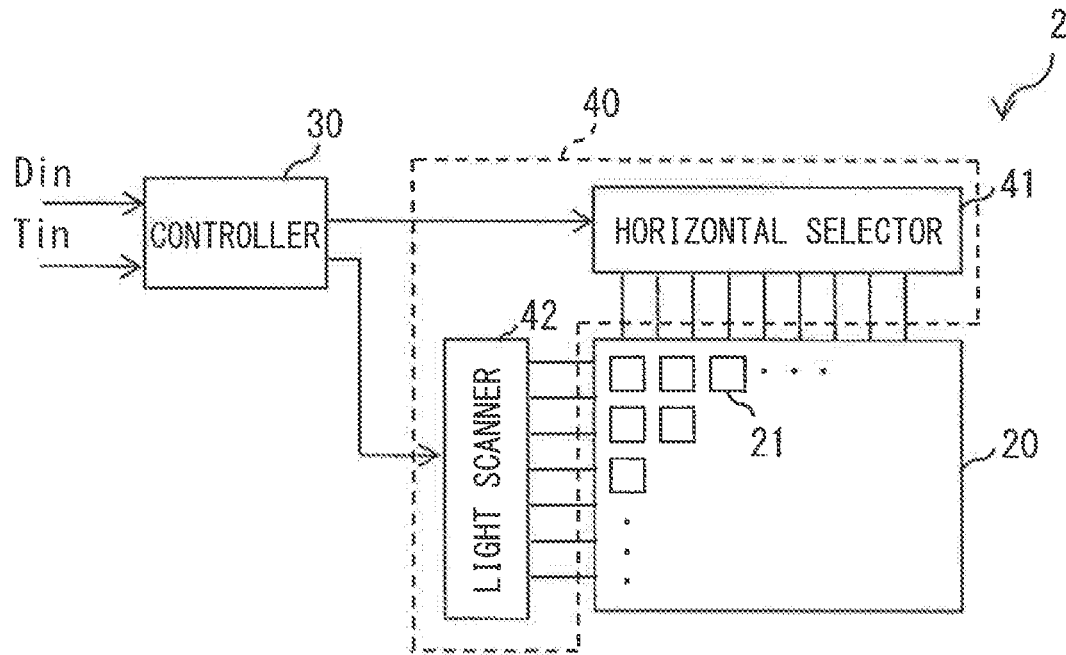
FIG. 10 illustrates an exemplary outline configuration of an organic electroluminescent element according to one embodiment of the disclosure.
Figure 11:
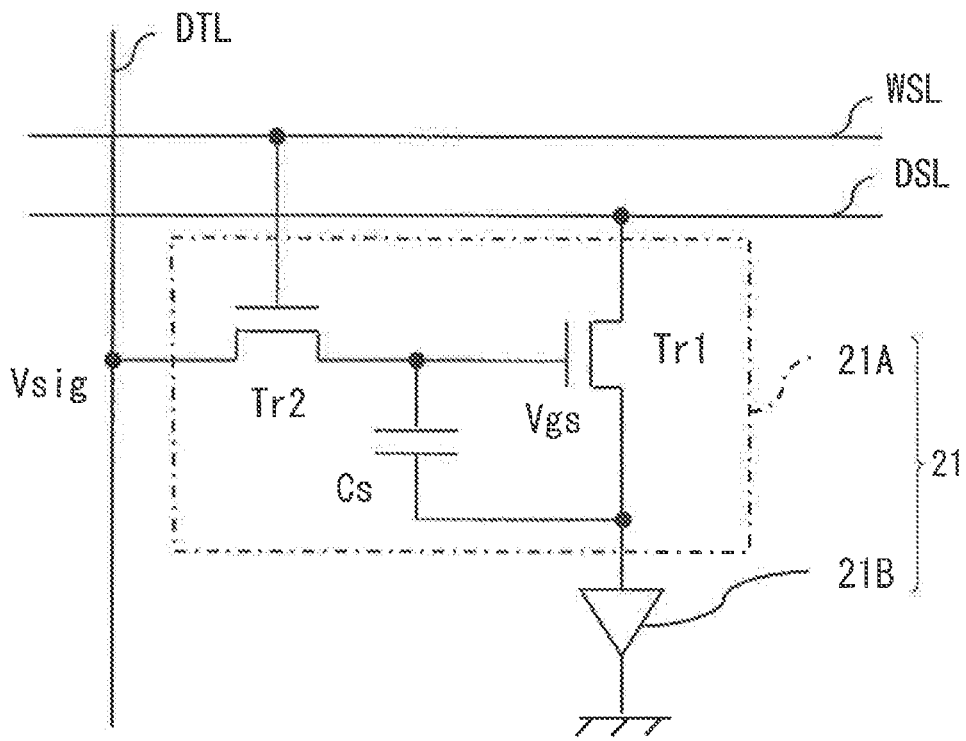
FIG. 11 illustrates an exemplary circuit configuration of a pixel illustrated in FIG. 10.

FIG. 10 illustrates an exemplary outline configuration of an organic electroluminescent unit 2 according to a second embodiment of the disclosure. FIG. 11 illustrates an exemplary circuit configuration of a pixel 21 in the organic electroluminescent unit 2. The organic electroluminescent unit 2 includes, for example, a display panel 20, a controller 30, and a driver 40. The driver 40 may be mounted on an outer edge of the display panel 20. The display panel 20 may include a plurality of pixels 21 arranged in matrix. The controller 30 and the driver 40 may drive the display panel 20 (i.e., the pixels 21) on the basis of an image signal Din and a synchronizing signal Tin received from an external device.

[Display Panel 20]

In response to the active-matrix driving of the pixels 21 performed by the controller 30 and the driver 40, the display panel 20 may display an image based on the image signal Din and the synchronizing signal Tin received from the external device. The display panel 20 may include a plurality of scanning lines WSL and a plurality of power lines DSL both extending in a row direction, a plurality of signal lines DTL extending in a column direction, and the plurality of pixels 21 arranged in matrix. The display panel 20 may include a substrate supporting the pixels 21, for example. Non-limiting examples of the substrate supporting the pixels 21 may include a glass substrate and a flexible substrate.

The scanning lines WSL may be used for selection of the pixels 21. In detail, the scanning lines WSL may supply a selection pulse to the respective pixels 21 to select the pixels 21 on a predetermined unit basis. In an exemplary embodiment, the pixels 21 are selected on a pixel-row basis. The signal lines DTL may supply, to the respective pixels 21, a signal voltage Vsig corresponding to the image signal Din. In detail, the signal lines DTL may supply, to the respective pixels 21, a data pulse including the signal voltage Vsig. The power lines DSL may supply electric power to the respective pixels 21.

The plurality of pixels 21 may include ones emitting red light, ones emitting green light, and ones emitting blue light, for example. In an exemplary embodiment, the pixels 21 may further include ones emitting light in another color, such as white or yellow.

The signal lines DTL may be each coupled to an output end of a horizontal selector 41 described below. Each of the signal lines DTL may be assigned to a corresponding pixel column, for example. The scanning lines WSL may be each coupled to an output end of a write scanner 42 described below. Each of the scanning lines WSL may be assigned to a corresponding pixel row, for example. The power lines DSL may be each coupled to an output end of a power source. Each of the power lines DSL may be each assigned to a corresponding pixel row, for example.

The pixels 21 may each include, for example, a pixel circuit 21A and an organic electroluminescent element 21B. The organic electroluminescent element 21B may be, for example, the organic electroluminescent element 1 of an exemplary embodiment of the disclosure. At least one of the pixels 21 in the display panel 20 may include the organic electroluminescent element 1 of an exemplary embodiment of the disclosure. In other words, at least one of the organic electroluminescent elements 21B in the display panel 20 may be the organic electroluminescent element 1 of an exemplary embodiment of the disclosure. For example, the pixels 21 emitting blue light may each include, as the organic electroluminescent element 21B, the organic electroluminescent element 1 of an exemplary embodiment of the disclosure.

The pixel circuit 21A may control light emission and light extinction of the organic electroluminescent element 21B. The pixel circuit 21A may hold a voltage written into the corresponding pixel 21 through write scanning described below. The pixel circuit 21A may include a driving transistor Tr1, a switching transistor Tr2, and a storage capacitor Cs, for example.

The switching transistor Tr2 may control application of the signal voltage Vsig to a gate of the driving transistor Tr1. The signal voltage Vsig may be based on the image signal Din. In an exemplary embodiment, the switching transistor Tr2 may sample a voltage of the signal line DTL and write the sampled voltage into the gate of the driving transistor Tr1. The driving transistor Tr1 may be coupled in series to the organic electroluminescent element 21B. The driving transistor Tr1 may drive the organic electroluminescent element 21B. The driving transistor Tr1 may control an electric current flowing through the organic electroluminescent element 21B on the basis of the magnitude of the voltage sampled at the switching transistor Tr2. The storage capacitor Cs may hold a predetermined voltage between the gate and a source of the driving transistor Tr1. The storage capacitor Cs may retain a gate-source voltage Vgs of the driving transistor Tr1 at a constant level for a predetermined period. Note that the pixel circuit 21A may have a circuit configuration that includes the 2Tr1C circuit described above and additional capacitors and transistors. In an exemplary embodiment, the pixel circuit 21A may have a circuit configuration different from that of the 2Tr1C circuit described above.

Each of the signal lines DTL may be coupled to an output end of the horizontal selector 41 described below and a source or a drain of the switching transistor Tr2. Each of the scanning lines WSL may be coupled to an output end of the write scanner 42 described below and a gate of the switching transistor Tr2. Each of the power lines DSL may be coupled to an output end of a power supply circuit 33 and the source or a drain of the driving transistor Tr1.

The gate of the switching transistor Tr2 may be coupled to the corresponding scanning line WSL. One of the source or the drain of the switching transistor Tr2 may be coupled to the corresponding signal line DTL. The other of the source or the drain, which is not coupled to the signal line DTL, of the switching transistor Tr2 may be coupled to the gate of the driving transistor Tr1. One of the source or the drain of the driving transistor Tr1 may be coupled to the corresponding power line DSL. The other of the source or the drain, which is not coupled to the power line DSL, of the driving transistor Tr1 may be coupled to the anode 11 of the organic electroluminescent element 21B. One end of the storage capacitor Cs may be coupled to the gate of the driving transistor Tr1. The other end of the storage capacitor Cs may be coupled to one of the source or the drain, adjacent to the organic electroluminescent element 21B, of the driving transistor Tr1.

[Driver 40]

The driver 40 may include the horizontal selector 41 and the write scanner 42, for example. The horizontal selector 41 may apply the analog signal voltage Vsig to each of the signal lines DTL, in response to or in synchronization with a control signal, for example. The analog signal voltage Vsig may be transmitted from the controller 30. The write scanner 42 may scan the pixels 21 on a predetermined unit basis.

[Controller 30]

The controller 30 is described in detail below. The controller 30 may perform predetermined correction on the digital image signal Din and generate the signal voltage Vsig on the basis of the image signal obtained through the predetermined correction, for example. The image signal Din may be transmitted from an external device, for example. The controller 30 may output the generated signal voltage Vsig to the horizontal selector 41, for example. The controller 30 may transmit a control signal to each circuit in the driver 40, in response to or in synchronization with the synchronizing signal Tin. The synchronizing signal may be transmitted from an external device, for example.

[Effects]

In an exemplary embodiment of the disclosure, at least one of the organic electroluminescent elements 21B in the display panel 20 may be the organic electroluminescent element 1 of an exemplary embodiment of the disclosure. Consequently, the organic electroluminescent unit 2 exhibits high light emission efficiency.

4. Application Examples

Application Example 1

Described below is an application example of the organic electroluminescent unit 2 of the second embodiment. The organic electroluminescent unit 2 is applicable to a variety of display units of electronic apparatuses that display, as images or pictures, image signals received from external devices or generated inside the display units. Non-limiting examples of the electronic apparatuses may include televisions, digital cameras, notebook personal computers, sheet-like personal computers, portable terminal devices such as mobile phones, and video cameras.

Figure 12:
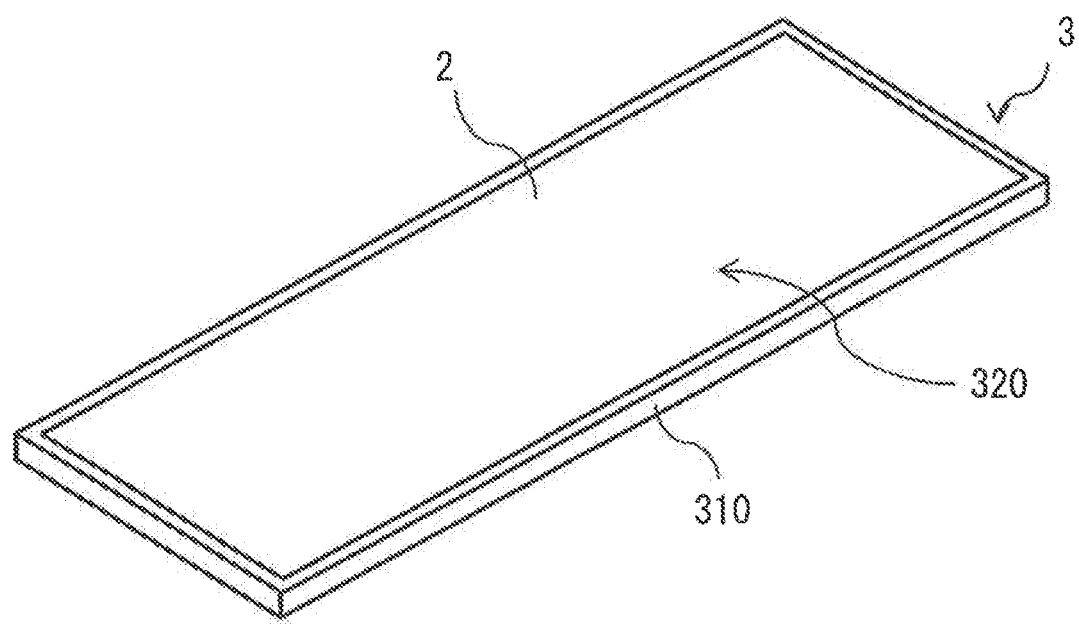
FIG. 12 is a perspective view of an external appearance of an electronic apparatus provided with an organic electroluminescent unit according to one embodiment of the disclosure.

FIG. 12 is a perspective view of an external appearance of an electronic apparatus 3 of the present application example. The electronic apparatus 3 may be, for example, a sheet-like personal computer including a body 310 having a display surface 320 on a main face. The organic electroluminescent unit 2 may be provided on the display surface 320 of the electronic apparatus 3. The organic electroluminescent unit 2 may be disposed such that the display panel 20 faces outward. The electronic apparatus 3 of the present application example including the organic electroluminescent unit 2 on the display surface 320 exhibits high light emission efficiency.

Application Example 2

Described below is an application example of the organic electroluminescent element 1 of the first embodiment. The organic electroluminescent element 1 is applicable to a variety of light sources in illumination apparatuses for table lightings, or floor lightings, and room lightings.

Figure 13:
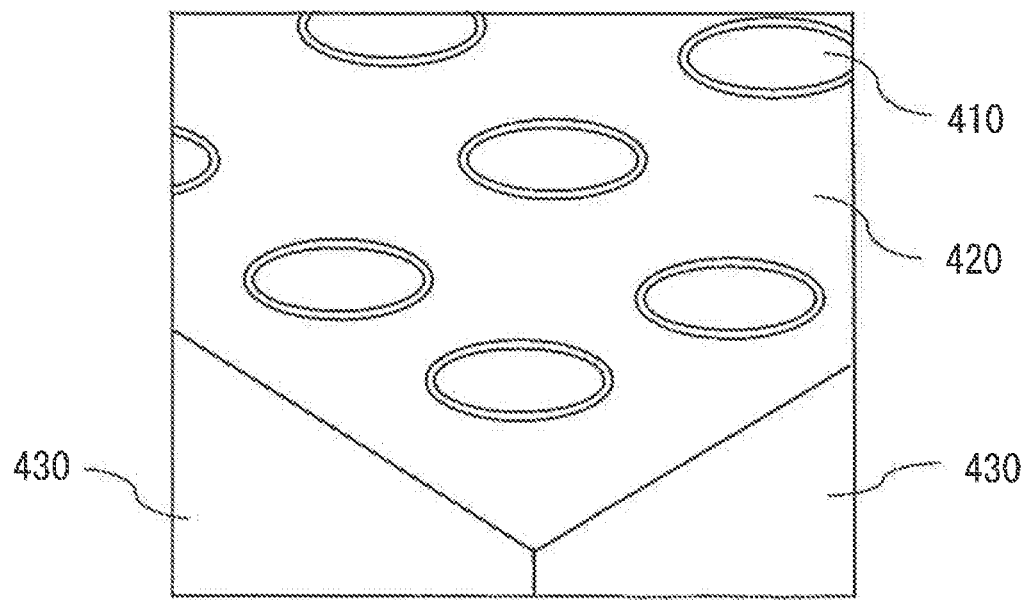
FIG. 13 is a perspective view of an external appearance of an illumination apparatus provided with an organic electroluminescent element according to one embodiment of the disclosure.

FIG. 13 illustrates an external appearance of an illumination apparatus for a room lighting to which the organic electroluminescent elements 1 are applied. The illumination apparatus may include, for example, illuminating sections 410 each including one or more of the organic electroluminescent elements 1. An appropriate number of the illuminating sections 410 are disposed at appropriate intervals on a ceiling 420. Note that the illuminating sections 410 may be installed on any place other than the ceiling 420, such as a wall 430 and a non-illustrated floor, depending on the intended use.

The illumination apparatus may perform illumination with light emitted from the organic electroluminescent elements 1. Accordingly, the illumination apparatus exhibits high light emission efficiency.

Although the disclosure is described hereinabove with reference to the embodiments, modification examples, and application examples, these embodiments, modification examples, and application examples are not to be construed as limiting the scope of the disclosure and may be modified in a wide variety of ways. It should be noted that the effects described hereinabove are mere examples. Effects of an embodiment of the disclosure are not limited to those described hereinabove. The disclosure may further include any effects other than those described hereinabove.

Moreover, the disclosure may have the following configurations, for example.

[1] An organic electroluminescent element including, in order:

a first electrode;
an organic light-emitting layer;
a buffer layer that includes an electrically-conductive organic material;
a metal thin film that includes a metal or a metal alloy;
an organic electron transport layer doped with a metal; and
a second electrode,
the metal in the metal thin film being same as the metal doped in the organic electron transport layer, the metal alloy in the metal thin film including a metal that is same as the metal doped in the organic electron transport layer.

[2] The organic electroluminescent element according to [1], in which the buffer layer satisfies following Expression (1):

$$|E1-E2|>0 \quad \text{Expression (1)},$$

where E1 denotes a work function of the metal thin film, and E2 denotes a lowest unoccupied molecular orbital energy level of the buffer layer.

[3] The organic electroluminescent element according to [2], in which the buffer layer satisfies following Expression (2):

$$0<|E1-E2|<0.6 \text{ eV} \quad \text{Expression (2)}.$$

[4] The organic electroluminescent element according to any one of [1] to [3], in which the buffer layer includes an organic material that is free from forming a metal complex even when the buffer layer is in contact with the metal thin layer.

[5] The organic electroluminescent element according to any one of [1] to [4], in which the metal doped in the organic electron transport layer includes a transition metal.

[6] The organic electroluminescent element according to [5], in which the metal doped in the organic electron transport layer includes ytterbium.

[7] The organic electroluminescent element according to any one of [1] to [6], further including a film-thickness adjusting layer that is provided between the organic electron transport layer and the second electrode, and includes a transparent electrically-conductive material.

[8] An organic electroluminescent element including, in order:
a first electrode;
an organic light-emitting layer;
a buffer layer that includes an electrically-conductive organic material;
a metal thin film that includes a metal or a metal alloy;
an organic electron injection layer doped with a metal; and
a second electrode,
the metal in the metal thin film being same as the metal doped in the organic electron injection layer, the metal alloy in the metal thin film including a metal that is same as the metal doped in the organic electron injection layer.

[9] The organic electroluminescent element according to [8], in which the buffer layer satisfies following Expression (1):

$$|E1-E2|>0 \quad \text{Expression (1)},$$

where E1 denotes a work function of the metal thin film, and E2 denotes a lowest unoccupied molecular orbital energy level of the buffer layer.

[10] The organic electroluminescent element according to [9], in which the buffer layer satisfies following Expression (2):

$$0<|E1-E2|<0.6 \text{ eV} \quad \text{Expression (2)}.$$

[11] The organic electroluminescent element according to any one of [8] to [10], in which the buffer layer includes an organic material that is free from forming a metal complex even when the buffer layer is in contact with the metal thin layer.

[12] The organic electroluminescent element according to any one of [8] to [11], in which the metal doped in the organic electron injection layer includes a transition metal.

[13] The organic electroluminescent element according to [12], in which the metal doped in the organic electron injection layer includes ytterbium.

[14] The organic electroluminescent element according to any one of [8] to [13], further including a film-thickness adjusting layer that is provided between the organic electron injection layer and the second electrode, and includes a transparent electrically-conductive material.

[15] An organic electroluminescent unit provided with a light-emitting panel and a driving circuit, the light-emitting panel including a plurality of organic electroluminescent elements, the driving circuit being configured to drive each of the plurality of organic electroluminescent elements, at least one of the plurality of organic electroluminescent elements including, in order:
a first electrode;
an organic light-emitting layer;
a buffer layer that includes an electrically-conductive organic material;
a metal thin film that includes a metal or a metal alloy;
an organic electron transport layer doped with a metal; and
a second electrode,
the metal in the metal thin film being same as the metal doped in the organic electron transport layer, the metal alloy in the metal thin film including a metal that is same as the metal doped in the organic electron transport layer.

[16] An organic electroluminescent unit provided with a light-emitting panel and a driving circuit, the light-emitting panel including a plurality of organic electroluminescent elements, the driving circuit being configured to drive each of the plurality of organic electroluminescent elements, at least one of the plurality of organic electroluminescent elements including, in order:
a first electrode;
an organic light-emitting layer;
a buffer layer that includes an electrically-conductive organic material;
a metal thin film that includes a metal or a metal alloy;
an organic electron injection layer doped with a metal; and
a second electrode,
the metal in the metal thin film being same as the metal doped in the organic electron injection layer, the metal alloy in the metal thin film including a metal that is same as the metal doped in the organic electron injection layer.

[17] An electronic apparatus with an organic electroluminescent unit, the organic electroluminescent unit being provided with a light-emitting panel and a driving circuit, the light-emitting panel including a plurality of organic electroluminescent elements, the driving circuit being configured to drive each of the plurality of organic electroluminescent elements, at least one of the plurality of organic electroluminescent elements including, in order:

a first electrode;
an organic light-emitting layer;
a buffer layer that includes an electrically-conductive organic material;
a metal thin film that includes a metal or a metal alloy;
an organic electron transport layer doped with a metal; and
a second electrode,
the metal in the metal thin film being same as the metal doped in the organic electron transport layer, the metal alloy in the metal thin film including a metal that is same as the metal doped in the organic electron transport layer.

[18] An electronic apparatus with an organic electroluminescent unit, the organic electroluminescent unit being provided with a light-emitting panel and a driving circuit, the light-emitting panel including a plurality of organic electroluminescent elements, the driving circuit being configured to drive each of the plurality of organic electroluminescent elements, at least one of the plurality of organic electroluminescent elements including, in order:
a first electrode;
an organic light-emitting layer;
a buffer layer that includes an electrically-conductive organic material;
a metal thin film that includes a metal or a metal alloy;
an organic electron injection layer doped with a metal; and
a second electrode,
the metal in the metal thin film being same as the metal doped in the organic electron injection layer, the metal alloy in the metal thin film including a metal that is same as the metal doped in the organic electron injection layer.

[19] An organic electroluminescent element including, in order:
a first electrode;
an organic light-emitting layer;
a buffer layer that includes an electrically-conductive organic material;
a metal thin film that includes a metal alloy; and
a second electrode,
the buffer layer satisfying following Expression (1):

$$|E1-E2|>0 \qquad \text{Expression (1),}$$

where E1 denotes a work function of the metal thin film, and where E2 denotes a lowest unoccupied molecular orbital energy level of the buffer layer.

[20] The organic electroluminescent element according to [19], in which the buffer layer satisfies following Expression (2):

$$0<|E1-E2|<0.6 \text{ eV} \qquad \text{Expression (2).}$$

[21] The organic electroluminescent element according to [19] or [20], in which the work function of the metal thin film has a minimum value out of work functions of metals included in layers other than the metal thin film, excluding the first electrode and the second electrode, in the organic electroluminescent element.

[22] The organic electroluminescent element according to [19] or [21], in which the buffer layer includes an organic material that is free from forming a metal complex even when the buffer layer is in contact with the metal thin layer.

[23] The organic electroluminescent element according to any one of [19] to [22], in which the metal doped in the organic electron injection layer includes a transition metal.

[24] The organic electroluminescent element according to [23], in which the metal doped in the organic electron injection layer includes ytterbium.

[25] The organic electroluminescent element according to any one of [19] to [24], further including a film-thickness adjusting layer that is provided between the organic electron injection layer and the second electrode, the film-thickness adjusting layer including a transparent electrically-conductive material.

[26] An organic electroluminescent unit provided with a light-emitting panel and a driving circuit, the light-emitting panel including a plurality of organic electroluminescent elements, the driving circuit being configured to drive each of the plurality of organic electroluminescent elements, at least one of the plurality of organic electroluminescent elements including, in order:
a first electrode;
an organic light-emitting layer;
a buffer layer that includes an electrically-conductive organic material;
a metal thin film that includes a metal alloy; and
a second electrode,
the buffer layer satisfying following Expression (1):

$$|E1-E2|>0 \qquad \text{Expression (1),}$$

where E1 denotes a work function of the metal thin film, and where E2 denotes a lowest unoccupied molecular orbital energy level of the buffer layer.

[27] An electronic apparatus with an organic electroluminescent unit, the organic electroluminescent unit being provided with a light-emitting panel and a driving circuit, the light-emitting panel including a plurality of organic electroluminescent elements, the driving circuit being configured to drive each of the plurality of organic electroluminescent elements, at least one of the plurality of organic electroluminescent elements including, in order:
a first electrode;
an organic light-emitting layer;
a buffer layer that includes an electrically-conductive organic material;
a metal thin film that includes a metal alloy; and
a second electrode,
the buffer layer satisfying following Expression (1):

$$|E1-E2|>0 \qquad \text{Expression (1),}$$

where E1 denotes a work function of the metal thin film, and where E2 denotes a lowest unoccupied molecular orbital energy level of the buffer layer.

In the organic electroluminescent element, the organic electroluminescent unit, and the electronic apparatus according to one embodiment of the disclosure, the buffer layer and the metal thin film is disposed between the organic light-emitting layer and the organic electron transport layer. The buffer layer includes an electrically-conductive organic material. The metal thin film includes a metal that is the same as the metal doped in the organic electron transport layer or a metal alloy including a metal that is the same as the metal doped in the organic electron transport layer. Accordingly, it is possible to suppress a reduction in light emission efficiency.

In the organic electroluminescent element, the organic electroluminescent unit, and the electronic apparatus according to one embodiment of the disclosure, the buffer layer and the metal thin film is disposed between the organic light-emitting layer and the organic electron injection layer. The buffer layer includes an electrically-conductive organic material. The metal thin film includes a metal that is the same as the metal doped in the organic electron injection layer or a metal alloy including a metal that is the same as the metal doped in the organic electron injection layer. Accordingly, it is possible to suppress a reduction in light emission efficiency.

It should be noted that the description hereinabove is merely exemplified. Effects of the disclosure are not limited to those described hereinabove. The disclosure may include some effects different from those described hereinabove and may further include additional effects.

Although the disclosure has been described in terms of exemplary embodiments, it is not limited thereto. It should be appreciated that variations may be made in the described embodiments by persons skilled in the art without departing from the scope of the disclosure as defined by the following claims. The limitations in the claims are to be interpreted broadly based on the language employed in the claims and not limited to examples described in this specification or during the prosecution of the application, and the examples are to be construed as non-exclusive. For example, in this disclosure, the use of the terms first, second, etc. do not denote any order or importance, but rather the terms first, second, etc. are used to distinguish one element from another. Moreover, no element or component in this disclosure is intended to be dedicated to the public regardless of whether the element or component is explicitly recited in the following claims.

What is claimed is:

1. An organic electroluminescent element comprising, in order:
   a first electrode;
   an organic light-emitting layer;
   a buffer layer that includes an electrically-conductive organic material, wherein the buffer layer is in direct contact with the organic-light emitting layer;
   a metal thin film that includes a metal or a metal alloy;
   an organic electron transport layer doped with a metal;
   a second electrode; and
   the metal in the metal thin film being same as the metal doped in the organic electron transport layer, the metal alloy in the metal thin film including a metal that is same as the metal doped in the organic electron transport layer.

2. The organic electroluminescent element according to claim 1, wherein the buffer layer satisfies following Expression (1):

$$|E1-E2|>0 \quad \text{Expression (1)},$$

where E1 denotes a work function of the metal thin film, and E2 denotes a lowest unoccupied molecular orbital energy level of the buffer layer.

3. The organic electroluminescent element according to claim 2, wherein the buffer layer satisfies following Expression (2):

$$0<|E1-E2|<0.6 \text{ eV} \quad \text{Expression (2)}.$$

4. The organic electroluminescent element according to claim 1, wherein the buffer layer includes an organic material that is free from forming a metal complex.

5. The organic electroluminescent element according to claim 1, wherein the metal doped in the organic electron transport layer comprises a transition metal.

6. The organic electroluminescent element according to claim 5, wherein the metal doped in the organic electron transport layer comprises ytterbium.

7. The organic electroluminescent element according to claim 1, further comprising a film-thickness adjusting layer that is provided between the organic electron transport layer and the second electrode, and includes a transparent electrically-conductive material.

8. The organic electroluminescent element according to claim 1, wherein a thickness of the metal thin film ranges from 0.1 nanometers (nm) to 2 nm.

9. The organic electroluminescent element according to claim 1, wherein the metal thin film directly contacts the buffer layer, and the organic electron transport layer directly contacts the metal thin film.

10. The organic electroluminescent element according to claim 1, further comprising a hole injection layer in contact with the second electrode.

11. The organic electroluminescent element according to claim 1, further comprising a hole transport layer in contact with the organic light-emitting layer.

* * * * *